(12) United States Patent
Lung et al.

(10) Patent No.: US 7,608,503 B2
(45) Date of Patent: Oct. 27, 2009

(54) SIDE WALL ACTIVE PIN MEMORY AND MANUFACTURING METHOD

(75) Inventors: Hsiang Lan Lung, Elmsford, NY (US); Shih-Hung Chen, Elmsford, NY (US); Yi-Chou Chen, Cupertino, CA (US)

(73) Assignee: Macronix International Co., Ltd., Hsinchu (TW)

( * ) Notice: Subject to any disclaimer, the term of this patent is extended or adjusted under 35 U.S.C. 154(b) by 325 days.

(21) Appl. No.: 11/285,473

(22) Filed: Nov. 21, 2005

(65) Prior Publication Data

US 2006/0110878 A1    May 25, 2006

Related U.S. Application Data

(60) Provisional application No. 60/630,123, filed on Nov. 22, 2004.

(51) Int. Cl.
*H01L 21/8242* (2006.01)
(52) U.S. Cl. .................. 438/253; 438/103; 438/685; 438/687; 438/178; 438/396; 257/167; 257/245; 257/250; 257/306; 257/532
(58) Field of Classification Search ................ 438/102, 438/103, 652, 656, 669, 685, 686, 687, 706, 438/745, 752, FOR. 134, FOR. 392, 178, 438/190, 210, 253, 396, FOR. 220, FOR. 430; 257/4, 167, 245, 250, E21.222, 296, 306, 257/532

See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 4,959,812 A | 9/1990 | Momodomi et al. | |
| 5,166,096 A | 11/1992 | Cote et al. | |
| 5,166,758 A | 11/1992 | Ovshinsky et al. | |

(Continued)

FOREIGN PATENT DOCUMENTS

| | | |
|---|---|---|
| TW | 200414298 | 3/2004 |
| WO | WO 00/45108 A1 | 8/2000 |
| WO | WO 00/79539 A1 | 12/2000 |
| WO | WO 01/45108 A1 | 6/2001 |

OTHER PUBLICATIONS

Adler, David, "Amorphous-Semiconductor Devices," Sci. Amer., vol. 236, pp. 36- 48, May 1977.

(Continued)

*Primary Examiner*—N Drew Richards
*Assistant Examiner*—Joannie A Garcia
(74) *Attorney, Agent, or Firm*—Haynes Beffel & Wolfeld LLP

(57) ABSTRACT

A method of forming a memory cell comprises forming a stack comprising a first electrode, an insulating layer over the first electrode, and a second electrode over the insulating layer, with a side wall on the stack. A side wall spacer comprising a programmable resistive material in electrical communication with the first and second electrodes is formed. The side wall spacer is formed by depositing a layer of programmable resistive material over the side wall of the stack, anisotropically etching the layer of programmable resistive material to remove it in areas away from the side wall, and selectively etching the programmable resistive material according to a pattern to define the width of the side wall spacer. In embodiments described herein, the width is about 40 nanometers or less.

34 Claims, 12 Drawing Sheets

U.S. PATENT DOCUMENTS

| | | | |
|---|---|---|---|
| 5,177,567 A | 1/1993 | Klersy et al. | |
| 5,391,901 A | 2/1995 | Tanabe et al. | |
| 5,515,488 A | 5/1996 | Stephens, Jr. | |
| 5,534,712 A | 7/1996 | Ovshinsky et al. | |
| 5,687,112 A | 11/1997 | Ovshinsky | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A | 2/2000 | Sandhu | |
| 6,031,287 A | 2/2000 | Harshfield | |
| 6,034,882 A | 3/2000 | Johnson et al. | |
| 6,066,870 A | 5/2000 | Siek | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,314,014 B1 | 11/2001 | Lowrey et al. | |
| 6,320,786 B1 | 11/2001 | Chang et al. | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,534,781 B2 | 3/2003 | Dennison | |
| 6,545,903 B1 | 4/2003 | Wu | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,620,715 B1 | 9/2003 | Blosse et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,744,088 B1 | 6/2004 | Dennison | |
| 6,746,892 B2 | 6/2004 | Lee et al. | |
| 6,749,971 B2 | 6/2004 | Lukanc et al. | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,805,563 B2 | 10/2004 | Xu | |
| 6,808,991 B1 | 10/2004 | Tung | |
| 6,815,704 B1 | 11/2004 | Chen | |
| 6,830,952 B2 | 12/2004 | Lung et al. | |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,888,750 B2 | 5/2005 | Walker et al. | |
| 6,894,305 B2 | 5/2005 | Yi et al. | |
| 6,903,362 B2 | 6/2005 | Wyeth et al. | |
| 6,909,107 B2 | 6/2005 | Rodgers et al. | |
| 6,927,410 B2 | 8/2005 | Chen | |
| 6,933,516 B2 | 8/2005 | Xu | |
| 6,936,840 B2 | 8/2005 | Sun et al. | |
| 6,937,507 B2 | 8/2005 | Chen | |
| 6,972,430 B2 | 12/2005 | Casagrande et al. | |
| 6,992,932 B2 | 1/2006 | Cohen | |
| 7,023,009 B2 | 4/2006 | Kostylev et al. | |
| 7,033,856 B2 | 4/2006 | Lung et al. | |
| 7,042,001 B2 | 5/2006 | Kim et al. | |
| 7,067,864 B2 | 6/2006 | Nishida et al. | |
| 7,067,865 B2 | 6/2006 | Lung | |
| 7,122,281 B2 | 10/2006 | Pierrat | |
| 7,122,824 B2 | 10/2006 | Khouri et al. | |
| 7,126,149 B2 | 10/2006 | Iwasaki et al. | |
| 7,132,675 B2 | 11/2006 | Gilton | |
| 7,166,533 B2 | 1/2007 | Happ | |
| 7,214,958 B2 | 5/2007 | Happ | |
| 7,220,983 B2 | 5/2007 | Lung | |
| 7,277,317 B2 | 10/2007 | Le Phan et al. | |
| 2001/0055838 A1 | 12/2001 | Walker et al. | |
| 2002/0081833 A1 | 6/2002 | Li et al. | |
| 2002/0182835 A1 | 12/2002 | Quinn | |
| 2004/0051094 A1 | 3/2004 | Ooishi | |
| 2004/0051161 A1 | 3/2004 | Tanaka et al. | |
| 2004/0087125 A1* | 5/2004 | Monoe | 438/592 |
| 2004/0180484 A1* | 9/2004 | Furukawa et al. | 438/197 |
| 2005/0029502 A1 | 2/2005 | Hudgens | |
| 2005/0093022 A1 | 5/2005 | Lung | |
| 2005/0124101 A1* | 6/2005 | Beintner | 438/197 |
| 2005/0164478 A1* | 7/2005 | Chan et al. | 438/585 |
| 2005/0167656 A1 | 8/2005 | Sun et al. | |
| 2005/0191804 A1* | 9/2005 | Lai et al. | 438/238 |
| 2005/0201182 A1 | 9/2005 | Osada et al. | |
| 2005/0202608 A1* | 9/2005 | Beintner | 438/164 |
| 2005/0212024 A1 | 9/2005 | Happ | |
| 2005/0215009 A1 | 9/2005 | Cho | |
| 2006/0043617 A1 | 3/2006 | Abbott | |
| 2006/0108667 A1 | 5/2006 | Lung | |
| 2006/0110878 A1 | 5/2006 | Lung et al. | |
| 2006/0118913 A1 | 6/2006 | Yi et al. | |
| 2006/0154185 A1 | 7/2006 | Ho et al. | |
| 2006/0175599 A1 | 8/2006 | Happ | |

| | | | |
|---|---|---|---|
| 2006/0226409 A1 | 10/2006 | Burr et al. | |
| 2006/0234138 A1 | 10/2006 | Fehlhaber et al. | |
| 2006/0284157 A1 | 12/2006 | Chen et al. | |
| 2006/0284158 A1 | 12/2006 | Lung et al. | |
| 2006/0284214 A1 | 12/2006 | Chen | |
| 2006/0284279 A1 | 12/2006 | Lung et al. | |
| 2006/0286709 A1 | 12/2006 | Lung et al. | |
| 2006/0286743 A1 | 12/2006 | Lung et al. | |
| 2007/0030721 A1 | 2/2007 | Segal et al. | |
| 2007/0037101 A1 | 2/2007 | Morioka | |
| 2007/0108077 A1 | 5/2007 | Lung et al. | |
| 2007/0108429 A1 | 5/2007 | Lung | |
| 2007/0108430 A1 | 5/2007 | Lung | |
| 2007/0108431 A1 | 5/2007 | Chen et al. | |
| 2007/0109836 A1 | 5/2007 | Lung | |
| 2007/0109843 A1 | 5/2007 | Lung et al. | |
| 2007/0111429 A1 | 5/2007 | Lung | |
| 2007/0115794 A1 | 5/2007 | Lung | |
| 2007/0117315 A1 | 5/2007 | Lai et al. | |
| 2007/0121363 A1 | 5/2007 | Lung | |
| 2007/0121374 A1 | 5/2007 | Lung et al. | |
| 2007/0126040 A1 | 6/2007 | Lung | |
| 2007/0131922 A1 | 6/2007 | Lung | |
| 2007/0131980 A1 | 6/2007 | Lung | |
| 2007/0138458 A1 | 6/2007 | Lung | |
| 2007/0147105 A1 | 6/2007 | Lung et al. | |
| 2007/0154847 A1 | 7/2007 | Chen et al. | |
| 2007/0155172 A1 | 7/2007 | Lai et al. | |
| 2007/0158632 A1 | 7/2007 | Ho | |
| 2007/0158633 A1 | 7/2007 | Lai et al. | |
| 2007/0158645 A1 | 7/2007 | Lung | |
| 2007/0158690 A1 | 7/2007 | Ho et al. | |
| 2007/0158862 A1 | 7/2007 | Lung | |
| 2007/0161186 A1 | 7/2007 | Ho | |
| 2007/0173019 A1 | 7/2007 | Ho et al. | |
| 2007/0173063 A1 | 7/2007 | Lung | |
| 2007/0176261 A1 | 8/2007 | Lung | |
| 2007/0224726 A1 | 9/2007 | Chen et al. | |
| 2007/0246699 A1 | 10/2007 | Lung | |
| 2007/0257300 A1 | 11/2007 | Ho et al. | |
| 2007/0262388 A1 | 11/2007 | Ho et al. | |
| 2007/0285960 A1 | 12/2007 | Lung et al. | |

OTHER PUBLICATIONS

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Blake thesis, "Investigation of GeTeSb5 Chalcogenide Films for Use as an Analog Memory," AFIT/GE/ENG/00M-04, Mar. 2000, 121 pages.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at 3$^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43$^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Bedeschi, F. et al., "4-MB MOSFET-Selected Phase-Change Memory Experimental Chip," IEEE, 2004, 4 pp.

Chen, et al., "Non-Volatile Resistive Switching for Advanced Memory Applications," IEEE IEDM, Dec. 5-7, 2005, 4 pp.

Gibson, G.A. et al., "Phase-change Recording Medium that Enables Ultrahigh-density Electron-beam Data Storage," Applied Physics Letter, 2005, 3 pp., vol. 86.

Happ, T.D. et al., "Novel None-Mask Self-Heating Pillar Phase Change Memory," 2006 Symposium on VLSI Technology, 2 pp.

Hudgens, S. et al., "Overview of Phase-Change Chalcogenide Nonvolatile Memory Technology," MRS Bulletin, Nov. 2004, pp. 829-832.

Iwasaki, Hiroko et al, "completely Erasable Phase Change Optical Disk," Jpn. J. Appl. Phys., Feb. 1992, pp. 461-465, vol. 31.

Lacita, A. L.; "Electrothermal and Phase-change Dynamics in Chalcogenide-based Memories," IEEE IEDM 2004, 4 pp.

"Magnetic Bit Boost," www.sciencenews.org <http://www.sciencenews.org>, Dec. 18 & 25, 2004, p. 389, vol. 166.

"New Memories Tap Spin, Gird for Battle," Science News, Apr. 3, 1999, p. 223, vol. 155.

Pirovano, Agostino et al., "Reliability Study of Phase-Change Nonvolatile Memories," IEEE Transactions on Device and Materials Reliability, Sep. 2004, pp. 422-427, vol. 4, No. 3.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Wuttig, Matthias, "Towards a Universal Memory?" Nature Materials, Apr. 2005, pp. 265-266, vol. 4.

Ahn, S. J. et al., "Highly Reliable 5nm Contact Cell Technology for 256Mb PRAM," VLSI Technology, Digest of Technical Papers, Jun. 14-16, 2005, pp. 98-99.

Notice of Allowance for U.S. Appl. No. 10/983,437 mailed on Feb. 14, 2008.

* cited by examiner

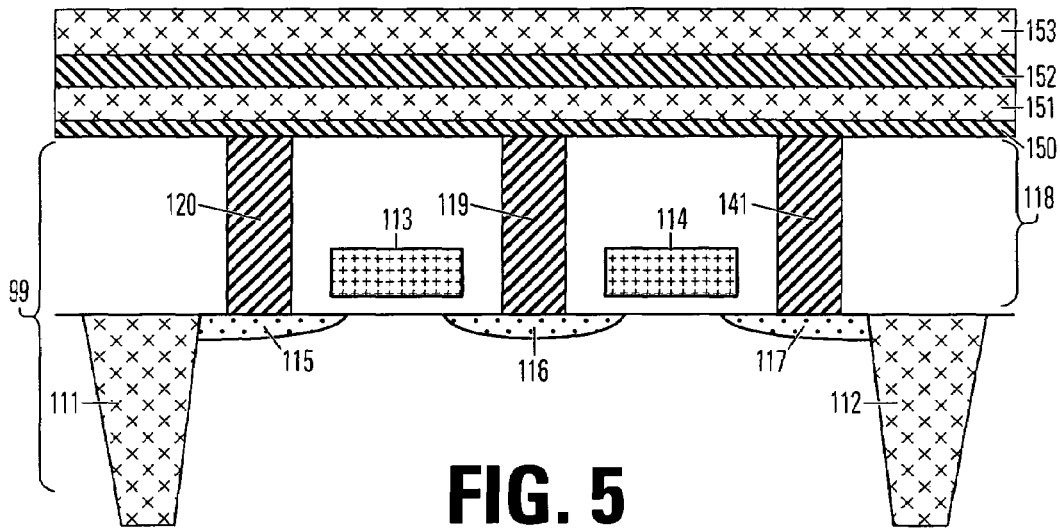
FIG. 5
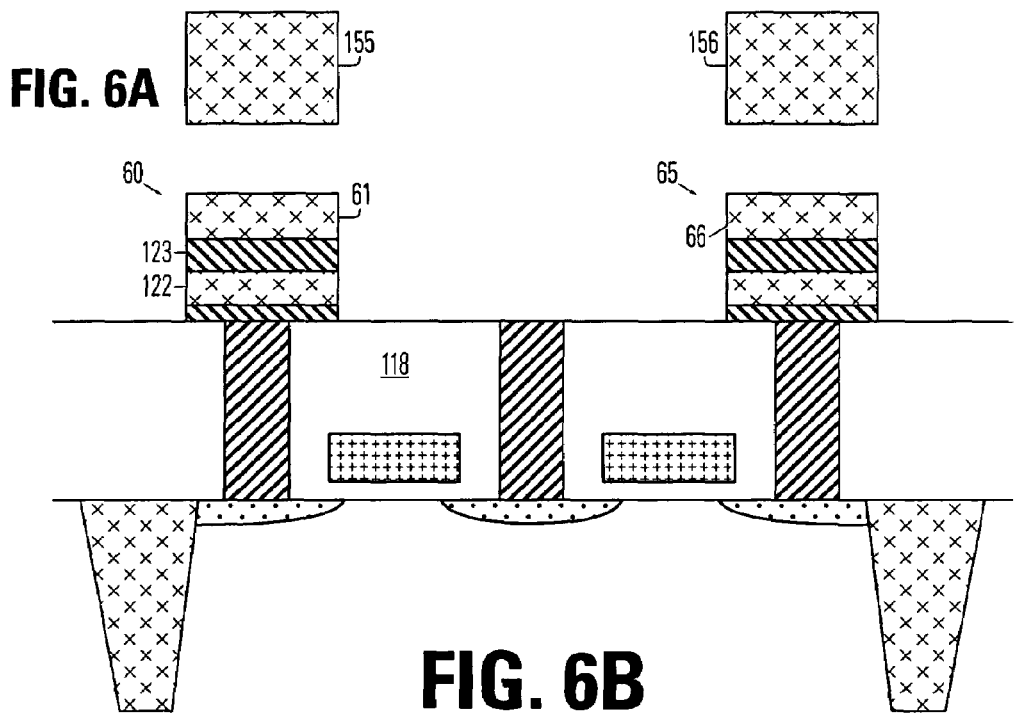
FIG. 6A
FIG. 6B

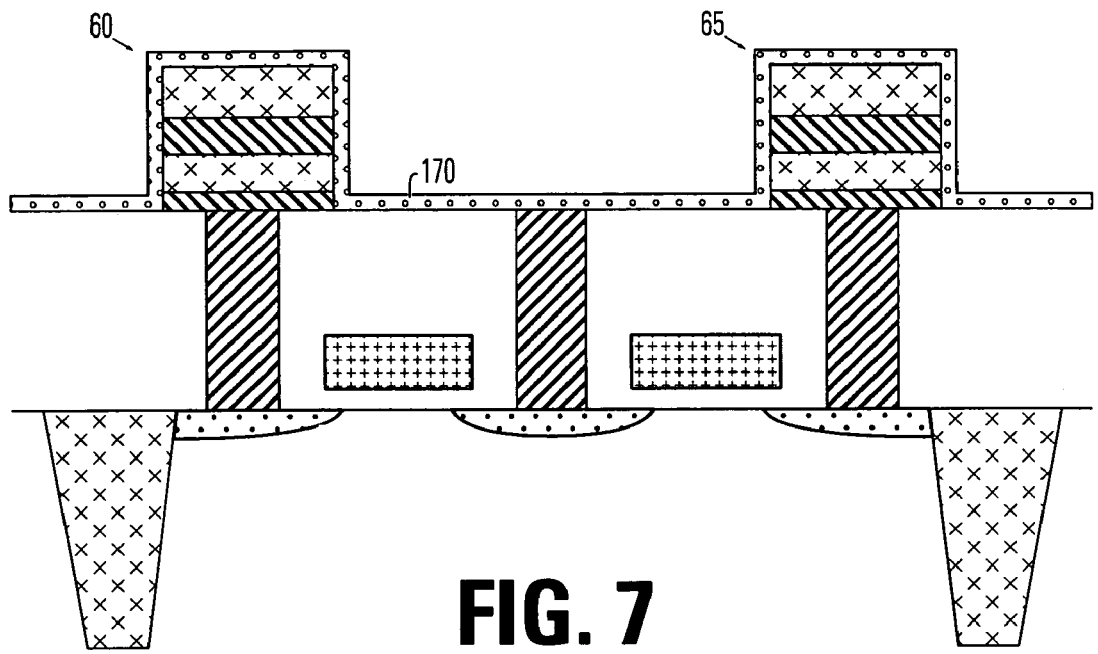
FIG. 7
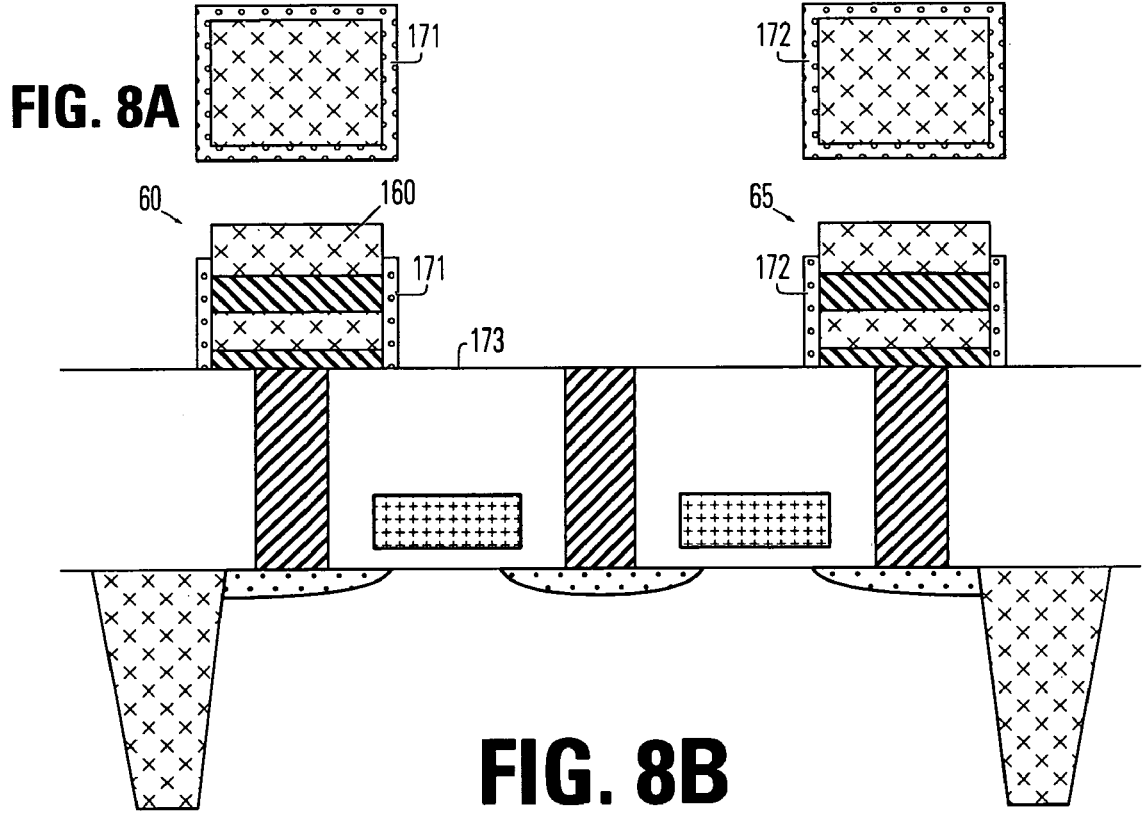
FIG. 8A
FIG. 8B

SIDE WALL ACTIVE PIN MEMORY AND MANUFACTURING METHOD

RELATED APPLICATION DATA

The benefit of U.S. Provisional Application No. 60/630,123; filed 22 Nov. 2004, entitled SIDE WALL ACTIVE PHASE CHANGE RAM AND MANUFACTURING METHOD, is hereby claimed.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on programmable resistive material, like phase change based memory materials, and to methods for manufacturing such devices.

2. Description of Related Art

Chalcogenide materials are widely used in read-write optical disks. These materials have at least two solid phases, generally amorphous and generally crystalline. Laser pulses are used in read-write optical disks to switch between phases and to read the optical properties of the material after the phase change.

Chalcogenide materials also can be caused to change phase by application of electrical current. This property has generated interest in using programmable resistive material to form nonvolatile memory circuits.

One direction of development has been toward using small quantities of programmable resistive material, particularly in small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

My U.S. Patent application Publication No. US-2004-0026686-A1 describes a phase change memory cell in which the phase change element comprises a side wall on an electrode/dielectric/electrode stack. Data is stored by causing transitions in the phase change material between amorphous and crystalline states using current. Current heats the material and causes transitions between the states. The change from the amorphous to the crystalline state is generally a lower current operation. The change from crystalline to amorphous, referred to as reset herein, is generally a higher current operation. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material.

Accordingly, an opportunity arises to devise methods and structures that form memory cells with structures that use small quantities of programmable resistive material.

SUMMARY OF THE INVENTION

The present invention includes devices and methods to form memory cell devices including a narrow side wall spacer or pin, comprising a programmable resistive material. A method of forming a memory cell is described which comprises forming a stack comprising a first electrode, an insulating layer over the first electrode, and a second electrode over the insulating layer, with a side wall on at least the insulating layer of the stack. A side wall spacer comprising a programmable resistive material in electrical communication with the first and second electrodes is formed. The side wall spacer has a length extending from the first electrode to the second electrode along the side wall, a width generally orthogonal to the length, and a thickness determined by the thickness of a layer of programmable resistive material used to form the side wall spacer. The side wall spacer is formed by depositing a layer of programmable resistive material over the side wall of the stack, anisotropically etching the layer of programmable resistive material to remove it in areas away from the side wall, and selectively etching the programmable resistive material according to a pattern to define the width of the side wall spacer. In embodiments described herein, the width is less than 50 nanometers, and more preferably about 40 nanometers or less.

In order to selectively etch the programmable resistive material according to a pattern to define a side wall spacer with such a narrow width, one technique includes forming an etch mask having a lithographic pattern to define a lithographic width, and then trimming the etch mask to provide a trimmed mask to define the pattern used for defining the width of the side wall spacer. In one example, the etch mask comprises a photoresist, which is etched anisotropically to form the trimmed mask using an oxygen based plasma etch. In another example, the etch mask comprises a hard mask defined using a lithographic process, which is etched to reduce its width to form the trimmed mask.

The three dimensions that define the size of the active region in the phase change pin for the cell described herein are preferably less than 50 nanometers, and can all be less than the minimum feature size of the lithographic process applied to make the cell. The dimensions are defined in technology described herein, by the thin film thickness of phase change material, the inter-electrode dielectric thin film thickness, and the trimmed mask. As a result, the cell size (the volume of the phase change material) is very small (smaller than $F^3$, where F is the minimum lithographic feature size for the process used to manufacture the memory cell). The resulting cell of phase change material comprises a narrow pin on the side wall of an electrode stack. The contact area between at least one of the top and bottom electrodes and the phase change material pin is also defined sub-lithographically by electrode layer thicknesses for the heights, and the photo-resist pattern trimming process for the width of the contacts. The small cell and small contact region allow implementation of a memory with very small reset current and low power consumption.

A memory device is also described that includes a stack including a first electrode, an inter-electrode insulating member over the first electrode, and a second electrode over the inter-electrode insulating member. The stack has a side wall over at least the insulating member. A spacer comprising programmable resistive material on the side wall is in electrical communication with the first and second electrodes. The spacer has a length extending from the first electrode to the second electrode along the side wall on the insulating layer, which is generally orthogonal to the length and a thickness. The width and thickness of the spacer are less than 40 nanometers in embodiments of the technology described herein. The programmable resistive material comprises a phase change material, which is reversibly programmable.

A memory array is described comprising a plurality of such memory devices with access transistors, arranged in a high density array of rows and columns. The access transistors comprise source and drain regions in a semiconductor substrate, and a gate coupled to word lines along rows of memory cells. The memory cells are formed in a layer above the access transistors on the integrated circuit, with a contact extending from the drain of a corresponding access transistor to the bottom electrode on the respective memory devices. Bit lines are formed using a layer of metallization above the memory cells, with contacts extending from the top electrode on the respective memory devices to corresponding bit lines along columns of memory cells in the array. In an embodiment described, two rows of memory cells share source contacts, with a common source line coupled to the source contact and extending generally parallel to the word lines through the array.

The method described herein for formation of the phase change material pin, can be used to make a very small pin for other uses on an integrated circuit or other device. The dimension of the pin is smaller than the minimum feature size (F) that one generation of lithography can provide. For example, the small dimension side wall pin can be formed on other types of stacks of thin films, such as stacks of thin film dielectrics, with and without an electrode layer for contact to the pin. Nano-technology devices with very small pin structures are provided using materials other than phase change materials, like metals, dielectrics, organic materials, semiconductors, and so on.

Other aspects and advantages of the technology described herein can be understood with reference to the figures and the detailed description which follow.

BRIEF DESCRIPTION OF THE DRAWINGS

FIG. 5 is a cross-section of the structure after front-end-of-line processing and formation of electrode stack thin film layers.

FIG. 6A and FIG. 6B show top and cross-sectional views respectively after electrode stack etching the structure from FIG. 5.

FIG. 7 shows phase change material thin film deposition on the structure of FIG. 6B.

FIG. 8A and FIG. 8B show top and cross-sectional views respectively after GST thin film spacer etching.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1:
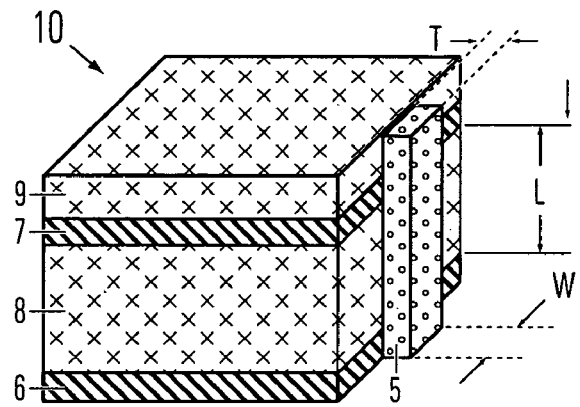
FIG. 1 illustrates an embodiment of a side wall active pin phase change memory element.

FIG. 1 is a perspective view of a side wall active pin memory cell 10. The cell includes a narrow side wall spacer, referred to as a pin 5 on a side wall of an electrode stack that includes a thin film electrode 6, and a thin film electrode 7 separated by an inter-electrode dielectric layer 8. A dielectric 9 overlies the electrode stack in the illustrated embodiment. The pin 5 consists of a programmable resistive material, such as a phase change material. The pin 5 has an active region, within which the phase change is confined, with a length L between a first electrode 6 and a second electrode 7 which is determined by the thickness of the inter-electrode dielectric layer 8. The active region of the pin 5 has a thickness T determined by the thickness of a thin film formed on the side wall of the electrode stack. The electrode stack is made using a photolithographic process or other type of lithographic process so that its width is about equal to the minimum feature size specified for the lithographic process. For advanced lithographic processes the width W of the electrode stack may be on the order of 90 nanometers. The active region of the pin 5 has a width which is less than the minimum feature size for the lithographic process used to define the electrode stack. In embodiments described herein, the width of the active region of the pin 5 is about 40 nanometers or less.

As illustrated, the active region of the pin 5 has a length L defined by a thin film thickness of the inter-electrode dielectric 8, which in embodiments of the invention can range between about 20 and 50 nanometers. Likewise, the active region of the pin 5 has a thickness T which is defined by the thin film thickness of the material used to form the side wall pin, which in embodiments of the invention can range between about 10 and 50 nanometers. Accordingly, all three dimensions of the pin 5 are less than 50 nanometers in embodiments of the present invention, and more preferably about 40 or less nanometers.

In embodiments of the invention, the programmable resistive material comprises a phase change material, such as $Ge_2Sb_2Te_5$ or other materials described below. The volume of material within the pin 5, in which the phase change is induced in the structure illustrated in FIG. 1, is therefore very small. For embodiments in which the length L, the width W and the thickness T of the active region of the pin 5 are less than 40 nanometers, the volume of the active region is less than $64 \times 10^{-24}$ m$^3$. Accordingly, the magnitude of the reset current required for changing the phase is very small.

Embodiments of the memory cell include phase change based memory materials, including chalcogenide based materials and other materials, for the side wall pin 5. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100(a+b)}$, where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change materials are capable of being switched between a first structural state in which the material is in a generally amorphous solid phase, and a second structural state in which the material is in a generally crystalline solid phase in its local order in the active channel region of the cell. These phase change materials are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change materials can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined empirically, without undue experimentation, specifically adapted to a particular phase change alloy.

In following sections of the disclosure, the phase change material is referred to as GST, and it will be understood that other types of phase change materials can be used. A material useful for implementation of a memory cell as described herein is $Ge_2Sb_2Te_5$.

Useful characteristics of the programmable resistive material, like a phase change material include the material having a resistance which is programmable, and preferably in a reversible manner, such as by having at least two solid phases that can be reversibly induced by electrical current. These at least two phases include an amorphous phase and a crystalline phase. However, in operation, the programmable resistive material may not be fully converted to either an amorphous or crystalline phase. Intermediate phases or mixtures of phases may have a detectable difference in material characteristics. The two solid phases should generally be bistable and have different electrical properties. The programmable resistive material may be a chalcogenide material. A chalcogenide material may include GST. Alternatively, it may be one of the other phase change materials identified above.

Figure 2:
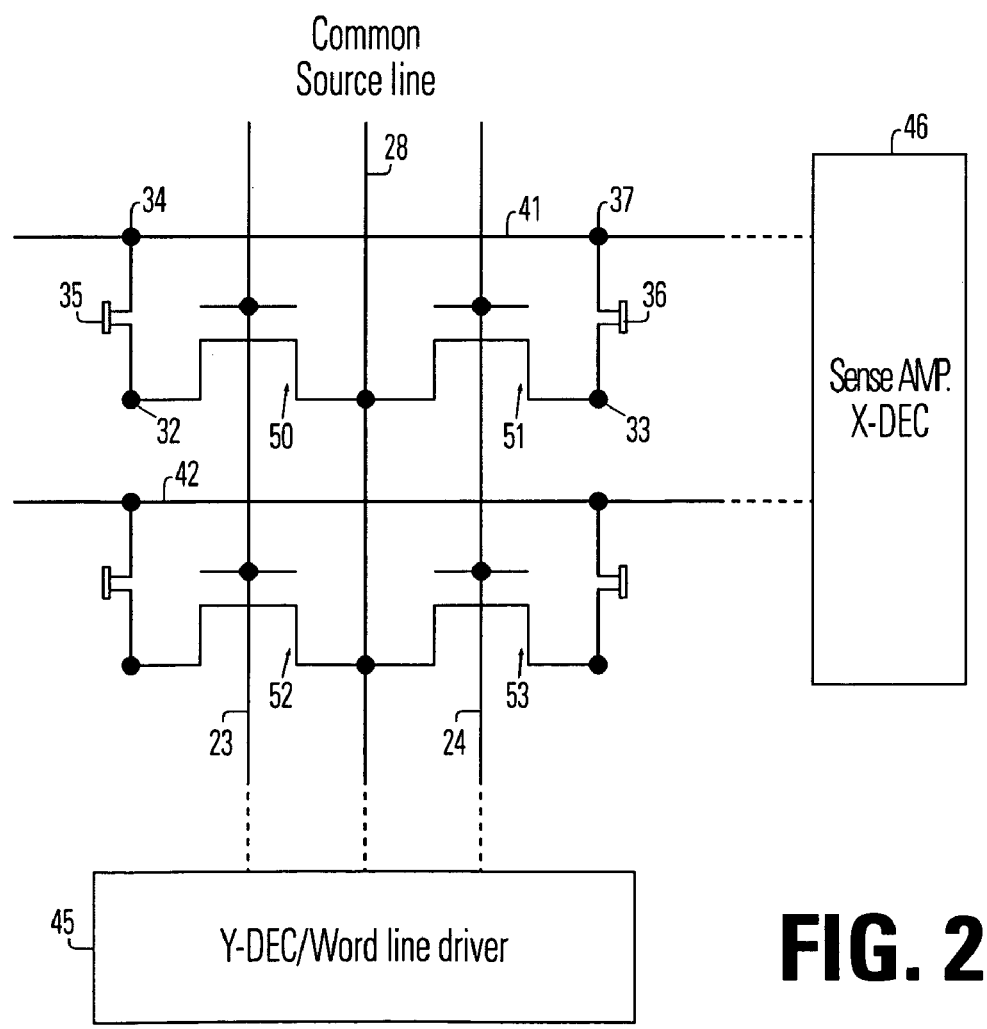
FIG. 2 is a schematic diagram for a memory array comprising phase change memory elements.

FIG. 2 is a schematic illustration of a memory array, which can be implemented as described herein. In the schematic illustration of FIG. 2, a common source line 28, a word line 23 and a word line 24 are arranged generally parallel in the Y-direction. Bit lines 41 and 42 are arranged generally parallel in the X-direction. Thus, a Y-decoder and a word line driver in block 45 are coupled to the word lines 23, 24. An X-decoder and a set of sense amplifiers in block 46 are coupled to the bit lines 41 and 42. The common source line 28 is coupled to the source terminals of access transistors 50, 51, 52 and 53. The gate of access transistor 50 is coupled to the word line 23. The gate of access transistor 51 is coupled to the word line 24. The gate of access transistor 52 is coupled to the word line 23. The gate of access transistor 53 is coupled to the word line 24. The drain of access transistor 50 is coupled to the bottom electrode member 32 for side wall pin memory cell 35, which has top electrode member 34. The top electrode member 34 is coupled to the bit line 41. Likewise, the drain of access transistor 51 is coupled to the bottom electrode member 33 for side wall pin memory cell 36, which has top electrode member 37. The top electrode member 37 is coupled to the bit line 41. Access transistors 52 and 53 are coupled to corresponding side wall pin memory cells as well on bit line 42. It can be seen that the common source line 28 is shared by two rows of memory cells, where a row is arranged in the Y-direction in the illustrated schematic. In other embodiments, the access transistors can be replaced by diodes, or other structures for controlling current flow to selected devices in the array for reading and writing data.

Figure 3:
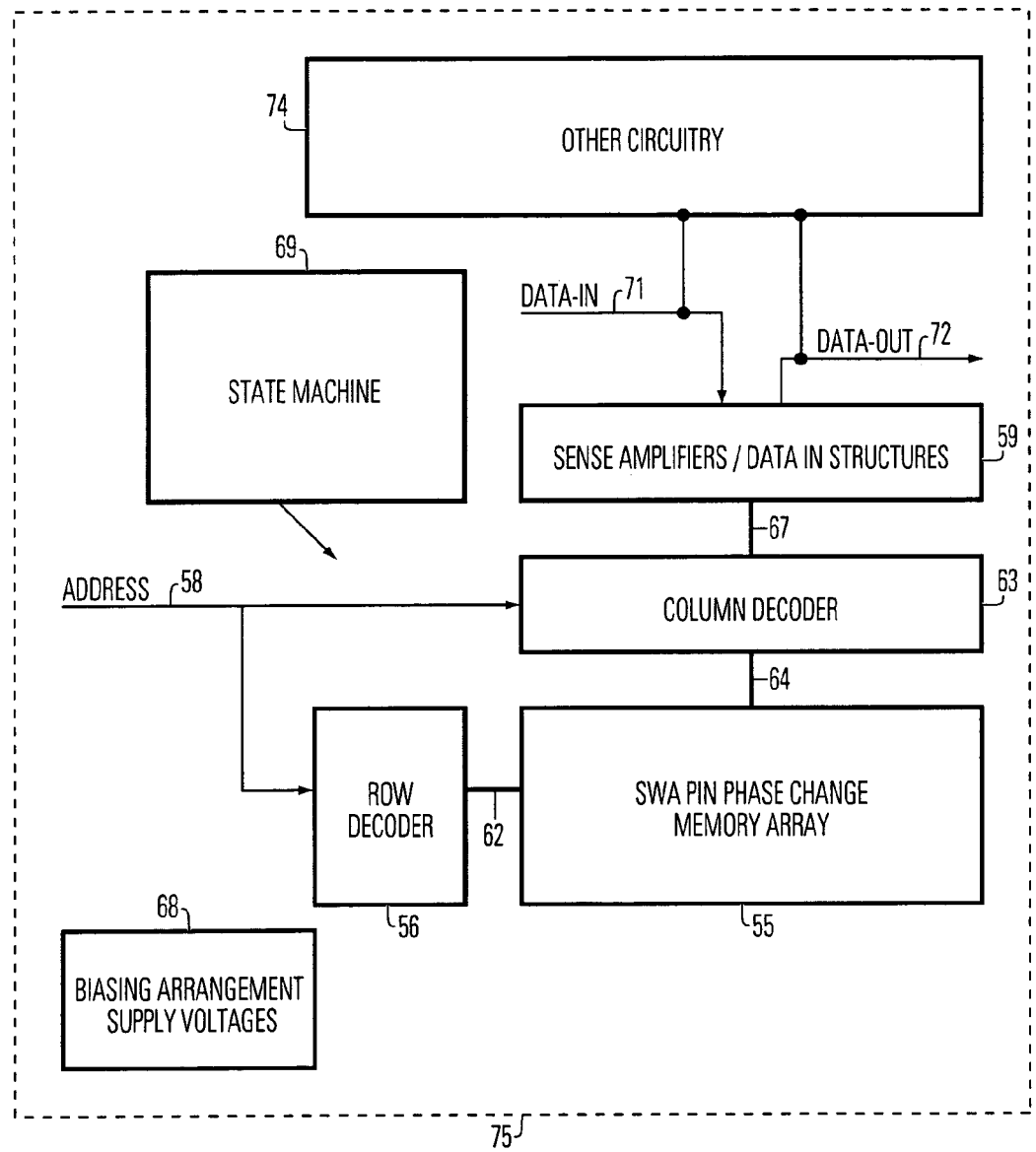
FIG. 3 is a block diagram of an integrated circuit device including a thin film fuse phase change memory array and other circuitry.

FIG. 3 is a simplified block diagram of an integrated circuit according to an embodiment of the present invention. The integrated circuit 74 includes a memory array 55 implemented using side wall active pin phase change memory cells, on a semiconductor substrate. A row decoder 56 is coupled to a plurality of word lines 62, and arranged along rows in the memory array 55. A column decoder 63 is coupled to a plurality of bit lines 64 arranged along columns in the memory array 55 for reading and programming data from the side wall pin memory cells in the array 55. Addresses are supplied on bus 58 to column decoder 63 and row decoder 56. Sense amplifiers and data-in structures in block 59 are coupled to the column decoder 63 via data bus 67. Data is supplied via the data-in line 71 from input/output ports on the integrated circuit 75 or from other data sources internal or external to the integrated circuit 75, to the data-in structures in block 59. In the illustrated embodiment, other circuitry is included on the integrated circuit, such as a general purpose processor or special purpose application circuitry, or a combination of modules providing system-on-a-chip functionality supported by the thin film fuse phase change memory cell array. Data is supplied via the data-out line 72 from the sense amplifiers in block 59 to input/output ports on the integrated circuit 75, or to other data destinations internal or external to the integrated circuit 75.

A controller implemented in this example using bias arrangement state machine 69 controls the application of bias arrangement supply voltages 68, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 4:
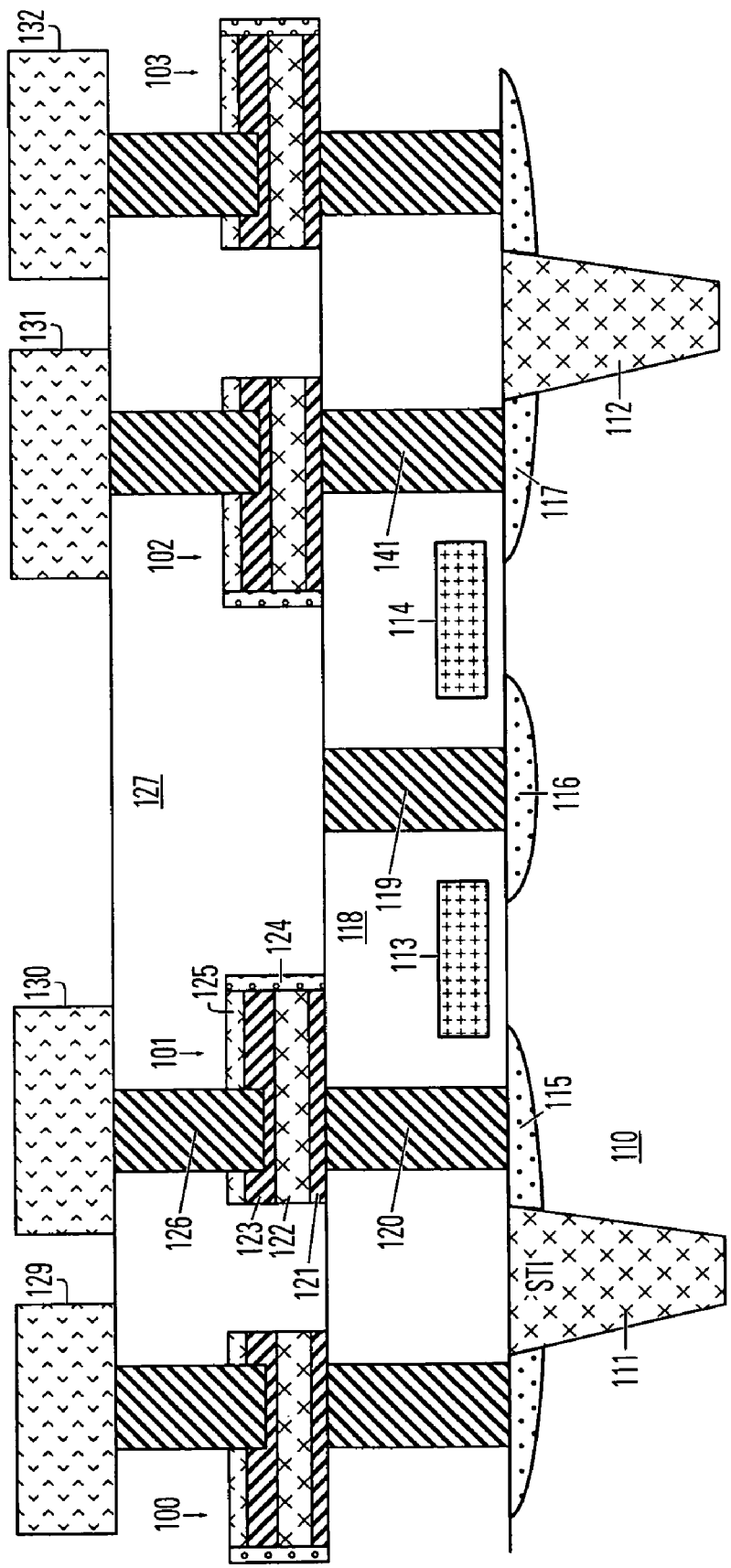
FIG. 4 is a cross-section of the final array structure for an embodiment of the invention.

FIG. 4 depicts a cross-section of a plurality of side wall active pin phase change random access memory cells 100-103. The cells 100-103 are formed on a semiconductor substrate 110. Isolation structures such as shallow trench isolation STI dielectric trenches 111 and 112 isolate pairs of rows of memory cell access transistors. The access transistors are formed by common source region 116 in the substrate 110, and drain regions 115 and 117 in the substrate 110. Polysilicon word lines 113 and 114 form the gates of the access transistors. The dielectric fill layer 118 is formed over the polysilicon word lines 113, 114. Contact plug structures 141 and 120 contact individual access transistor drains, and common source line 119 contacts source regions along a row in the array. The common source line 119 contacts the common source region 116. The plug structure 120 contacts a bottom electrode 121 of cell 101. The cell 101, like cells 100, 102 and 103, includes a thin film bottom electrode 121, a thin film inter-electrode dielectric layer 122, a thin film top electrode 123, and a side wall pin 124 comprising GST or another phase change material. A dielectric fill layer 127 overlies the cells 100-103. Tungsten plug 126 contacts the top electrode 123. A patterned metal layer providing contacts 129, 130, 131, 132 overlies the dielectric fill layer 127. Typically the contacts 129-132 are part of a single bit line extending to decoding circuits as can be seen with reference to FIG. 2. A thin oxide layer 125 is shown overlying the top electrode 123. The layer 125 is used for process margin as described below.

In representative embodiments, the patterned metal layer (contacts 129-132) comprises copper metallization. Other types of metallization, including aluminum and aluminum alloys, could be utilized as well. The top and bottom electrodes (e.g. 121, 123) comprise TiN or TaN with a thickness of 10 to 30 nm. Alternatively, the electrodes may be TiAlN or TaAlN, or may comprise one or more elements selected from the group consisting of Ti, W, Mo, Al, Ta, Cu, Pt, Ir, La, Ni, Ru and O. The inter-electrode insulating layer may be silicon oxide, silicon oxynitride, silicon nitride, $Al_2O_3$, other low K dielectrics, or an ONO or SONO multi-layer structure. Alternatively, the inter-electrode insulating layer may comprise one or more elements selected from the group consisting of Si, Ti, Al, Ta, N, O, and C. The inter-electrode thickness may be 10 to 200 nm, and more preferably 50 nanometers or less. The second electrode may be TiN or TaN.

FIG. 5 illustrates a structure 99 after front-end-of-line processing, forming the standard CMOS components in the illustrated embodiment corresponding to the word lines, the source line, and the access transistors in the array shown in FIG. 2. In FIG. 5, source line 119 overlies doped region 116 in the semiconductor substrate, where the doped region 116 corresponds with the source terminal of a first access transistor on the left in the figure, and of a second access transistor on the right in the figure. In this embodiment, the source line 119 extends to the top surface of the structure 99. In other embodiments the source line does not extend all the way to the surface. Doped region 115 corresponds with the drain terminal of the first access transistor. A word line including polysilicon 113, and silicide cap (not shown), acts as the gate of the first access transistor. Dielectric layer 118 overlies the polysilicon word line 113. Plug 120 contacts doped region 115, and provides a conductive path to the surface of the structure 99 for contact to a memory cell electrode as described below. The drain terminal of the second access transistor is provided by doped region 117. A word line including polysilicon line 114, and the silicide cap (not shown) acts as the gate for the second access transistor. Plug 141 contacts doped region 117 and provides a conductive path to the top surface of the structure 99 for contact to a memory cell electrode as described below. Isolation trenches 111 and 112 separate the two-transistor structure coupled to the plugs 120 and 141, from adjacent two-transistor structures. The structure 99 illustrated in FIG. 5 provides a substrate for formation of memory cell components, as described in more detail below.

After formation of the plugs 120, 141 and source line 119 for the structure 99, a multilayer, thin film structure is formed including bottom electrode thin film 150, top electrode thin film 152, inter-electrode dielectric 151, and protective top dielectric 153. The bottom electrode film 150 has a thickness less than 50 nanometers, and preferably in the range of 10 to 30 nanometers. The top electrode film 152 has a thickness less than 50 nanometers, and preferably in the range of 10 to 30 nanometers, and can be different than that of the bottom electrode film. For example, the thickness of the top electrode film 152 can be slightly greater than that of the bottom electrode, in order to improve process margin for reliable contacts using tungsten plug technology and the like. The top dielectric 153 provides process margin for use of chemical mechanical polishing for planarization, variations in side wall spacer etching, and the like. Alternative embodiments without the top dielectric 153 might be implemented.

FIG. 6A shows a mask pattern in top view including a first rectangle 155 and a second rectangle 156 for etching the multilayer thin film structure of FIG. 5, to form the electrode stacks 60, 65, as shown in cross-section in FIG. 6B. The electrode stack 60 includes the bottom electrode 121, inter-electrode dielectric 122, and the top electrode 123. The electrode stack 60 has side wall 61. Likewise, the electrode stack 65 has side wall 66. Reactive ion etching REI is utilized in order to establish side walls 61, 66 as vertical as possible. Although not shown in the diagram, the reactive ion etching RIE may over-cut into the dielectric fill layer 118. In a representative process the over-cut is about 20 nanometers. $BCl_3$ and/or $Cl_2$ based recipes for the processes can be used.

FIG. 7 illustrates a structure after depositing, by sputtering for example, a conformal layer 170 of GST, or other programmable resistive material, over the stacks 60, 65. GST can be deposited using sputtering without collimation at about 250 degrees C. This results in a thin film having a thickness on the top of the electrode stacks of about 60 to 80 nanometers, a thickness on the side walls of about 20 to 30 nanometers, and a thickness between the stacks of about 60 to 80 nanometers, when using $Ge_2Sb_2Te_5$ as the phase change material. Various embodiments of the process can sputter the entire wafer to thickness of 40 to 100 nanometers on the flat surfaces.

FIG. 8A illustrates the results of side wall etching in plan view, by an etching processes which remove the GST layer from the flat surfaces, and leave side walls 171 on stack 60 and side walls 172 on stack 65, completely surrounding the stacks 60, 65. Anisotropic $Cl_2$ and/or $BCl_3$ recipe RIE processes can be used. FIG. 8B shows the side walls 171 and 172 in cross-section. The side walls have tops slightly below the surface of the top dielectric layer 160, due to slight over-etching to ensure total removal from the surface 173 of the structure 99.

Figure 9:
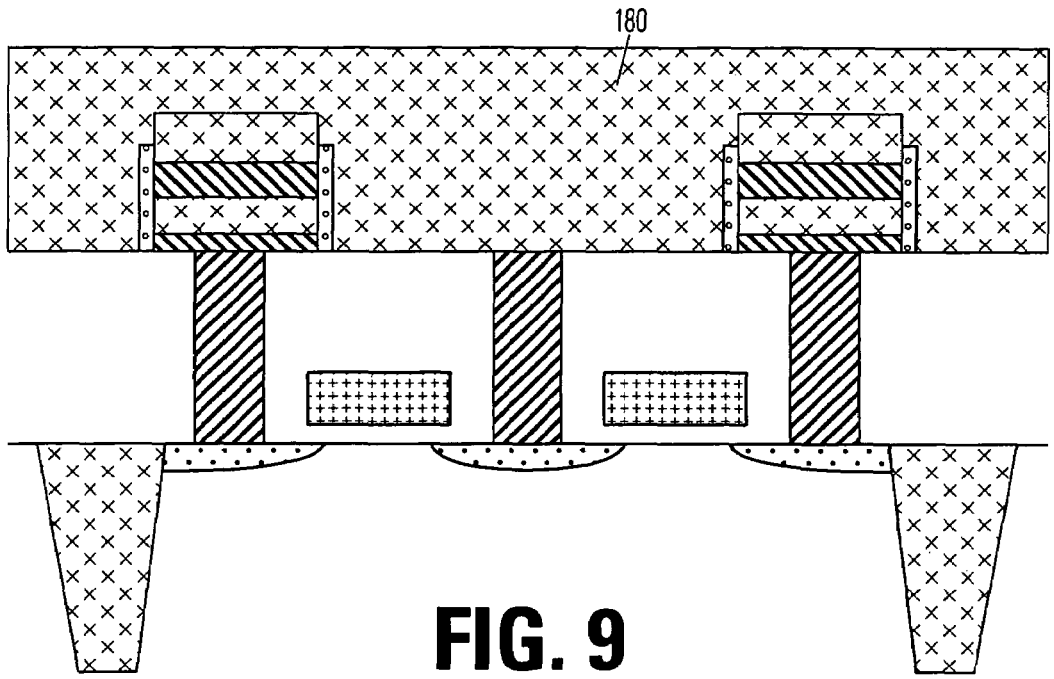
FIG. 9 shows a cross-sectional view after dielectric fill layer formation.

FIG. 9 illustrates a dielectric fill-in process. The process involves formation of a low-temperature liner oxide, a silicon nitride layer or silicon oxide layer (not shown), using a process temperature less than about 200 degrees C., over the phase change material side walls. One suitable process is to apply silicon dioxide using plasma enhanced chemical vapor deposition PECVD. After formation of the liner, the dielectric fill 180 is implemented using a higher temperature process such as high-density plasma HDP CVD of silicon dioxide or other similar material.

Figure 10:
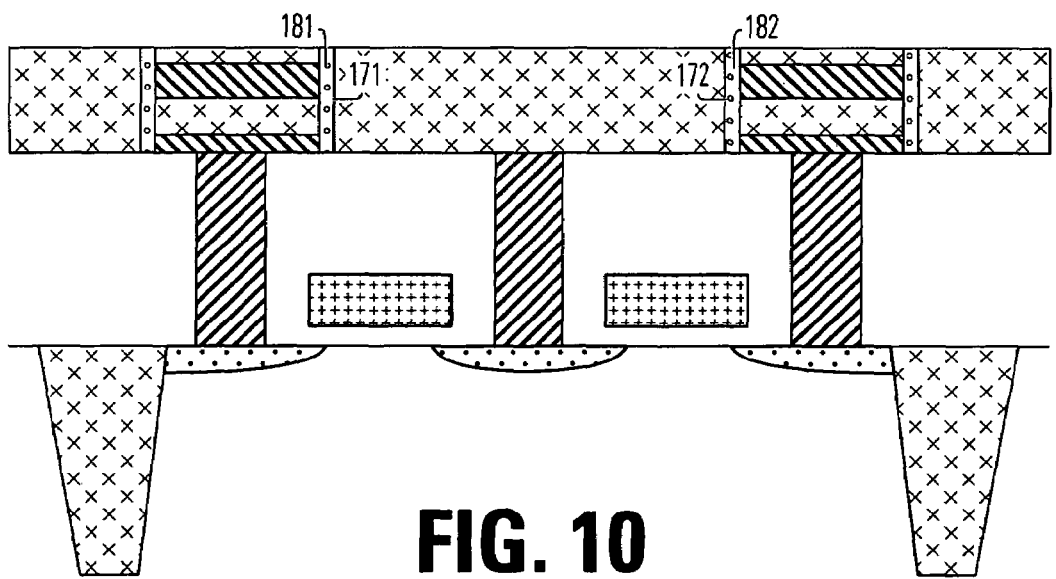
FIG. 10 shows a cross-sectional view after chemical mechanical polishing for planarization and exposure of the phase change material side wall.

As illustrated in FIG. 10, an oxide chemical mechanical polishing CMP process is applied to planarize the structure, and to expose the tops 181, 182 of the GST side walls 171, 172. The top dielectric layer on the electrode stack ensures that the CMP does not touch the top electrode material, such as TiN, and protects it from following RIE processes or other etching steps.

Figure 11:
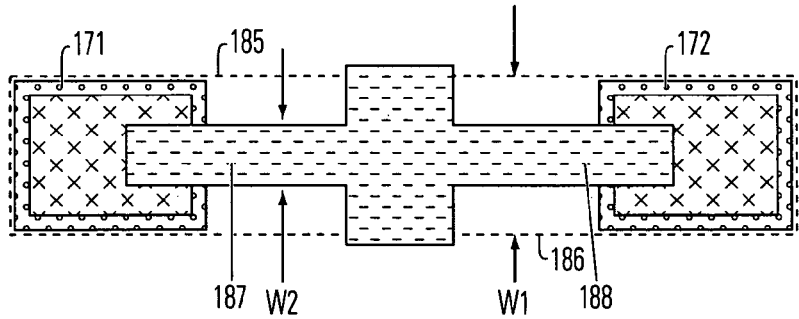
FIG. 11 shows a top view after formation of a photoresist pattern, and trimming for definition of phase change side wall pin width.

FIG. 11 illustrates photoresist pattern trimming for the purpose of forming a sub-lithographic mask to trim the side walls 171, 172. A photo resist pattern is formed using lithographic techniques involving transferring a pattern from a mask or set of masks to the photoresist layer, including a rectangular extension 185 over the stack 60 and a rectangular extension 186 over the stack 65 as shown in dotted line outline. The width W1 of the extensions 185, 186 after development of the photoresist, is close to the minimum feature size for the lithographic process utilized to form the pattern extension 185, 186. Next, the width W1 of the extensions 185, 186 is reduced to sub-lithographic width W2 by photoresist trimming to leave a narrow trimmed mask 187, 188. For example, the photoresist is etched anisotropically using an oxide plasma to trim the width and thickness of the patterned photoresist, down to a width W2 less than 50 nanometers in exemplary embodiments, and to width W2 of for example about 40 nanometers in a 0.2 micron (200 nanometer) minimum feature size lithographic process environment.

In an alternative embodiment, a hard mask layer (not shown), such as a low temperature deposited layer of SiN or $SiO_2$, can be put between the photoresist pattern and the surface of the stacks 60, 65, to prevent etching damage of the cell, if the photoresist is not thick enough after the trimming process, or selective etching of the GST and the hard mask is improved by the hard mask.

Figure 12A:
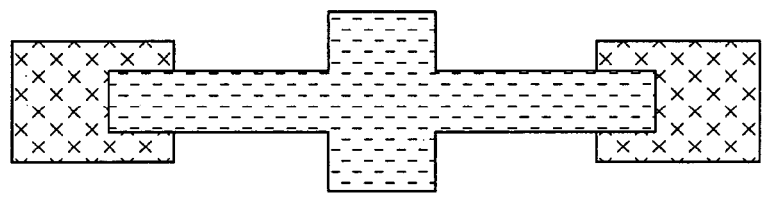
FIG. 12A and FIG. 12B show top and cross-sectional views respectively after selective etching of the phase change material side wall to define a phase change side wall pin width dimension.
Figure 12B:
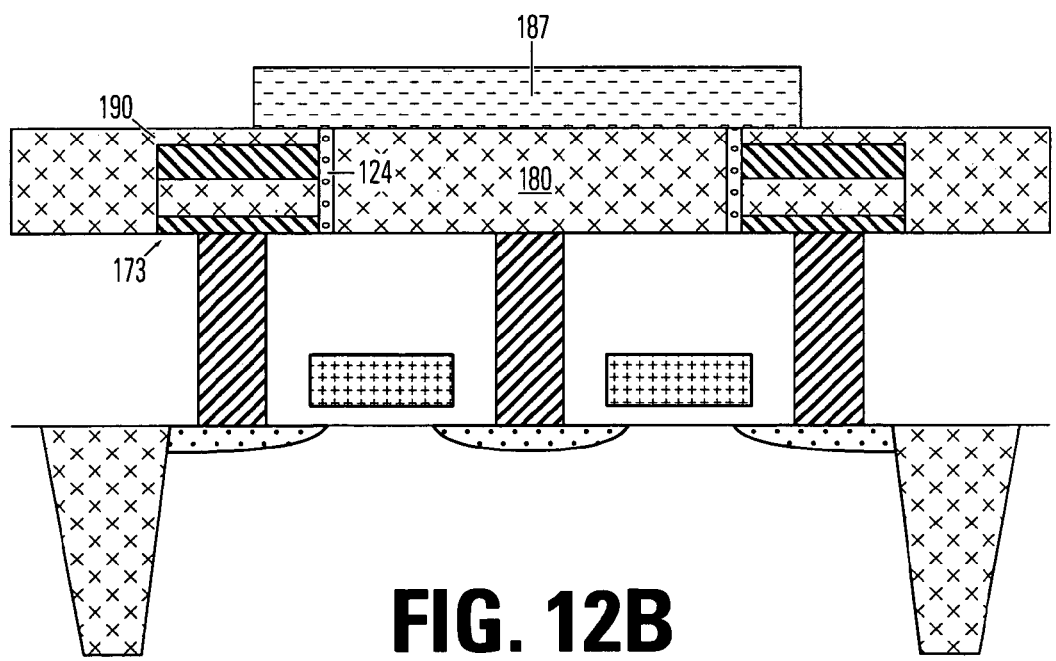

FIG. 12A illustrates side wall cell width etching in plan view according to the trimmed mask 187, 188, using for example a chlorine based reactive ion etch so that the dielectric fill 180 is not etched. The etch removes the exposed GST, leaving a narrow side wall pin 124 shown in cross-section in FIG. 12B, on the electrode stack. A seam 190 around the stack 60 and the stack 65 is left in the dielectric layer 180, which preferably extends to the top surface 173 of the structure 99 with complete removal of the GST. In embodiments of the process, all the GST in the seam 190 need not be removed. Rather it is sufficient that a significant portion of the GST in the seam 190 is removed, so that current between the bottom and top electrodes is concentrated in a narrow pin on the inter-electrode dielectric layer of the stack.

Figure 13:
FIG. 13 shows a top view after removal of the photoresist, with the resulting phase change material side wall pin.

FIG. 13 illustrates the next step in the process in plan view, which involves removal of the trimmed photoresist mask (187, 188) and hard mask layer (if any). The side wall pin 124 on stack 60 and side wall pin 124A on stack 65 have a sub-lithographic width W on the order of 40 nanometers or less in embodiments of the process.

Figure 14:
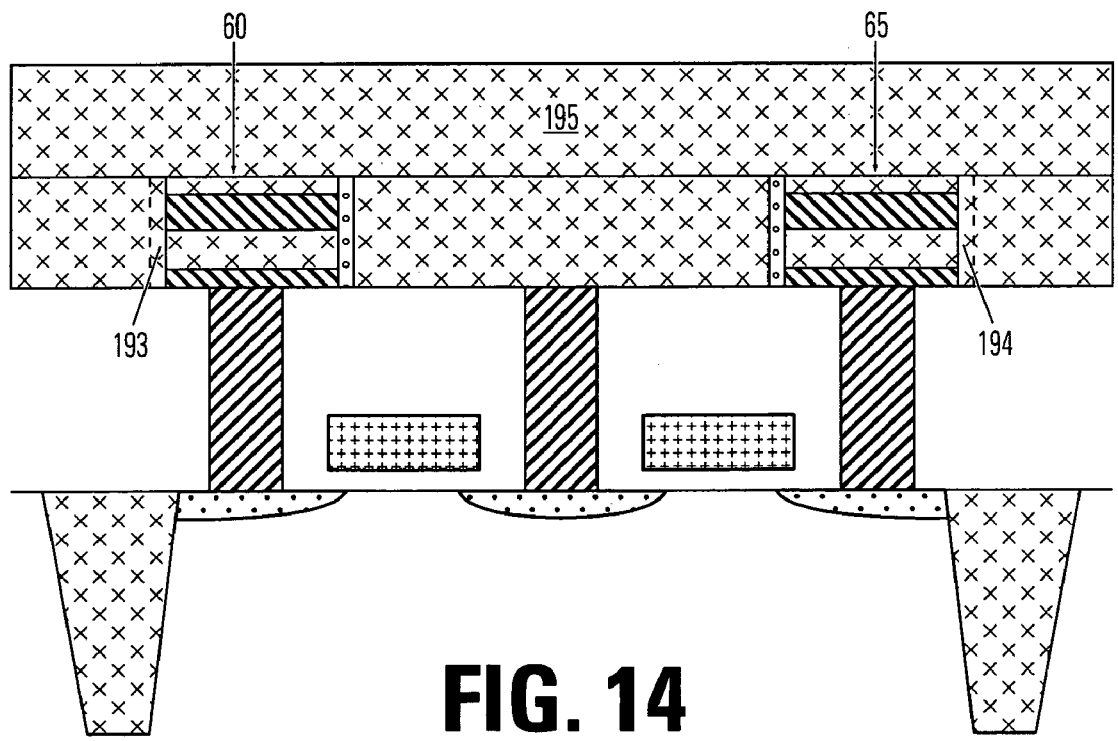
FIG. 14 shows a cross-sectional view after filling in the small seam left by removal of the phase change material side wall, and subsequent oxide deposition.

FIG. 14 illustrates the small seam fill-in and oxide deposition step. The small seams 190 (FIG. 13B) left by the removal of the side walls can be filled with electrical and/or thermally insulating fills 193, 194, using atomic layer deposition. In representative embodiments, atomic layer deposition is used to deposit dielectric material such as $AlO_2$, $HfO_2$ and the like. In other embodiments, the seams can be filled by spin coating silicon oxide using inorganic spin on glass or "low K" material. In an alternative, the seams are sealed to form a void that is substantially evacuated, to provide good thermal isolation for the cells. Next, a top oxide deposition covers the electrode stacks with a layer 195 of dielectric, which is planarized in preparation for subsequent metallization. The top oxide layer is preferably formed by PECVD, or other lower temperature process.

Figure 15:
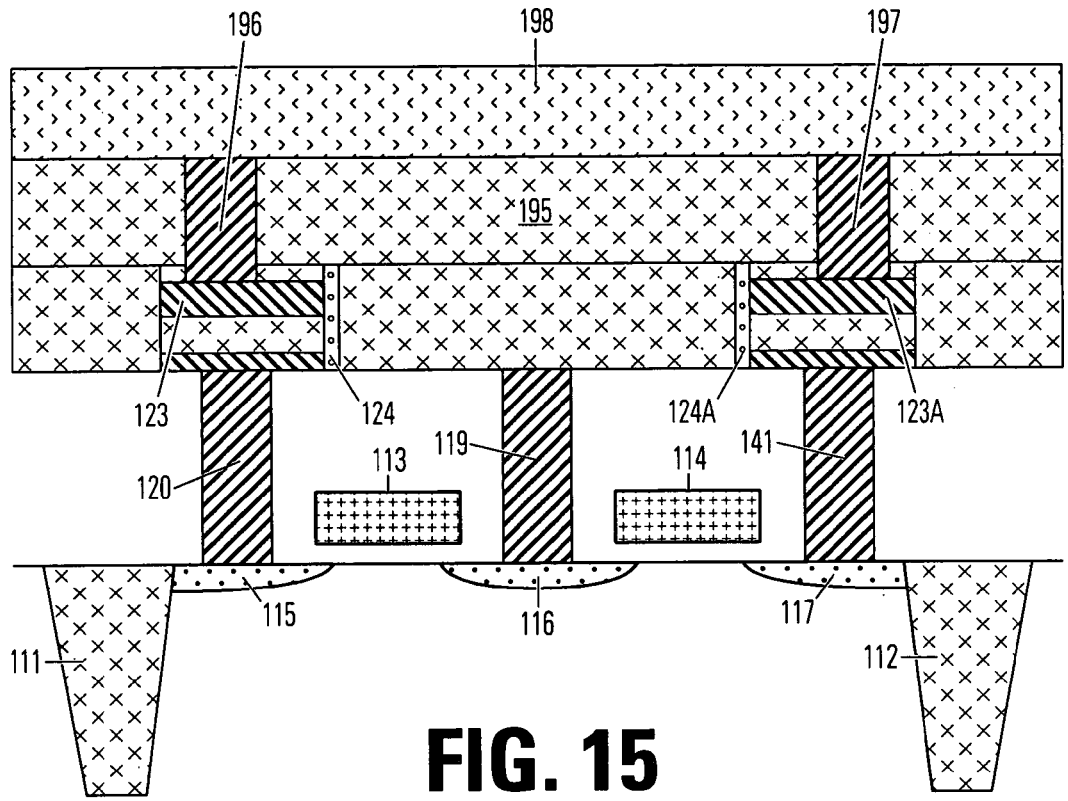
FIG. 15 shows top and cross-sectional views after via formation and metallization for definition of the bit lines.

FIG. 15 shows via formation and metallization for bit lines and contacts to the memory cells. Vias are etched in the layer 195 and filled with tungsten or other conductor material to form plugs 196 and 197 making contact to the top electrode layer 123 in stack 60 and top electrode layer 123A in stack 65. A patterned metal layer 198 provides bit lines extending in the plane of the drawing to decoding circuits. As described above, the plugs 120 and 141 provide contacts between the respective bottom electrodes of the stacks 60 and 65, to the drains 115 and 117 of the access transistors. The word lines 113, 114 are formed by the polysilicon gates on the access transistors. The common source diffusion 116, and metal line 119, provides for sensing current flow from the bit lines through the memory cells, to the access transistor and down the common source line.

Figure 16:
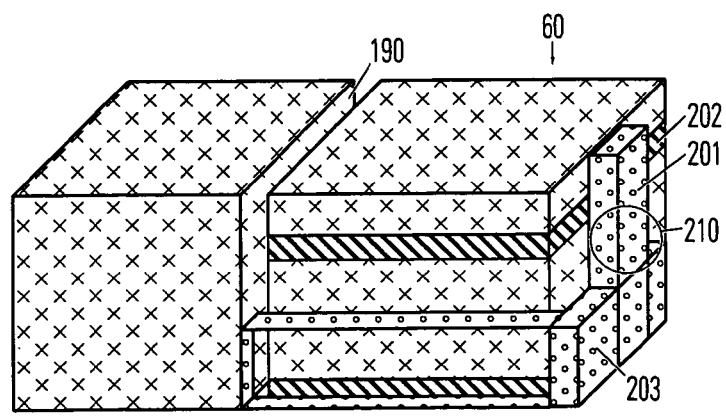
FIG. 16 illustrates an embodiment in which the thin film phase change material side wall is partially etched.

FIG. 16 shows a cross-section of an electrode stack, such as stack 60, after deposition of the GST layer side wall etching, in an alternative embodiment, in which the GST layer is only partially etched around the periphery of the electrode stack, leaving a residual layer 203 in the bottom of the seam (190, see FIG. 12B) around the stack. In the embodiment of FIG.

16, the pin 201 has a sub-lithographic width where it contacts the top electrode layer 202, extending into the inter-electrode dielectric layer, so that current flow is concentrated in the narrow region 210 of the phase change material pin.

Figure 17:
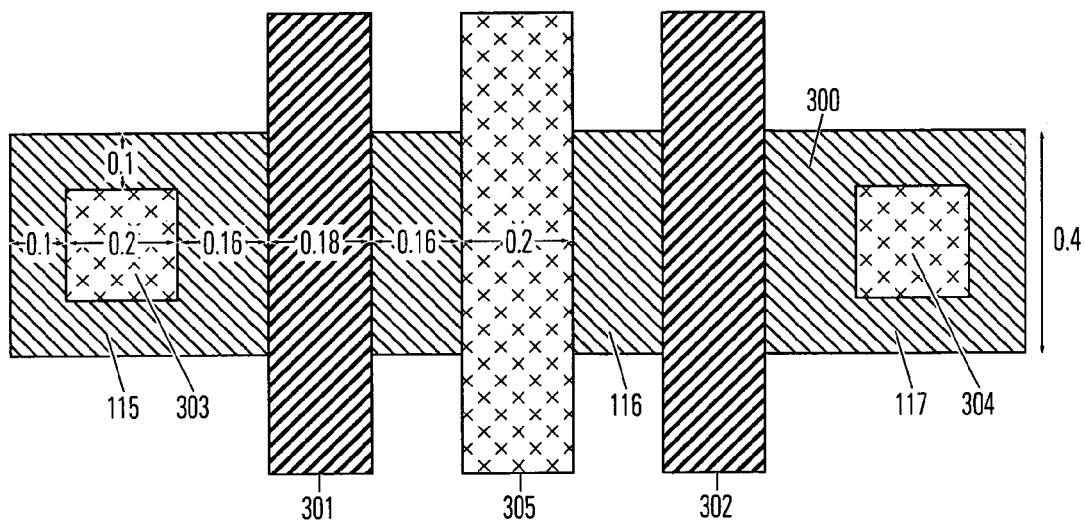
FIG. 17 is a layout view showing active area, polysilicon gate and tungsten plug mask shapes.

FIGS. 17 through 21 are layout views for masks used in processes as described above. FIG. 17 shows layout of the active region 300 for formation of the doped regions 115, 116, 117. In the embodiment shown, the width of the active region 300 is about 0.4 microns. Also, the layout of the polysilicon lines 301, 302 is shown for formation of the word lines 113, 114 as shown in FIG. 4. The polysilicon lines 301, 302 intersect the active region 300, and are typically formed before implantation of the doping material. The width of the polysilicon lines 301, 302 is about 0.18 microns in the embodiment illustrated. The access transistors which result have a transistor width of about 0.4 microns, and a transistor length of about 0.18 microns in this example. Also shown in FIG. 17 is the layout of the tungsten common source line 305, and contact plugs at 303, 304, used for formation of the common source line 119, and the plugs 120, 141 of FIG. 4. In the illustrated embodiment, the common source line 305 is about 0.2 microns wide, and the tungsten plugs are about 0.2 microns square. The tungsten plugs 303, 304 are placed about 0.1 microns from the edges of the active region 300, and about 0.16 microns from the side of the polysilicon lines 301, 302. The distance between the polysilicon lines 301 and 302 in the common source line 305 is about 0.16 microns in the illustrated embodiment.

Figure 18:
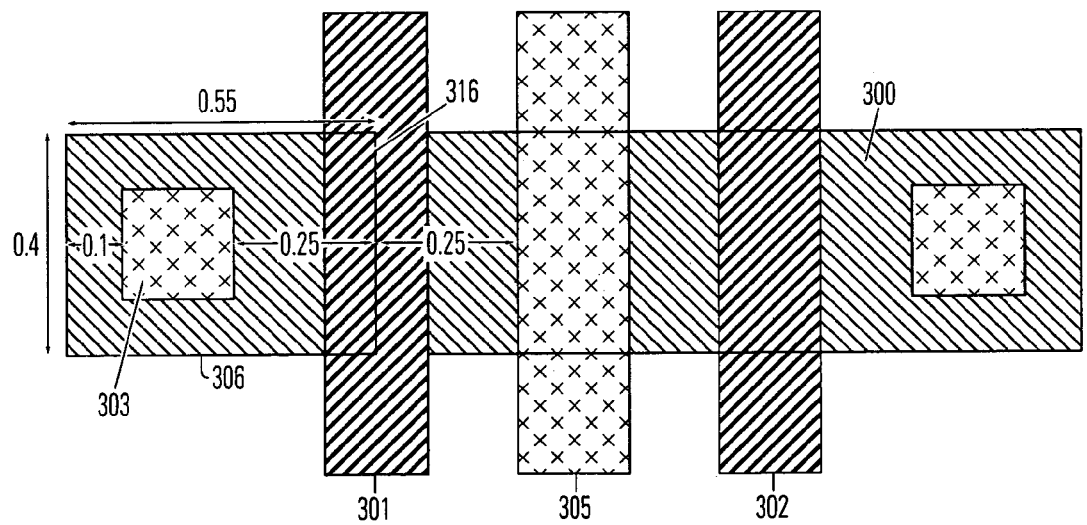
FIG. 18 is a layout view showing the electrode stack mask shape.

FIG. 18 illustrates the layout of the rectangle 306 used for definition of an electrode stack, such as the stack used for formation of the cell 101 in FIG. 4. In the illustrated embodiment, the rectangle is about 0.4 microns wide, and about 0.55 microns long. Subject to mask alignment variations, the edge 316 of the rectangle 306 over the polysilicon line 301 is about 0.25 microns from the edge of the tungsten plug 303. Also, the edge 316 of the rectangle 306 over the polysilicon line 301 is about 0.25 microns from the edge of the common source line 305.

Figure 19:
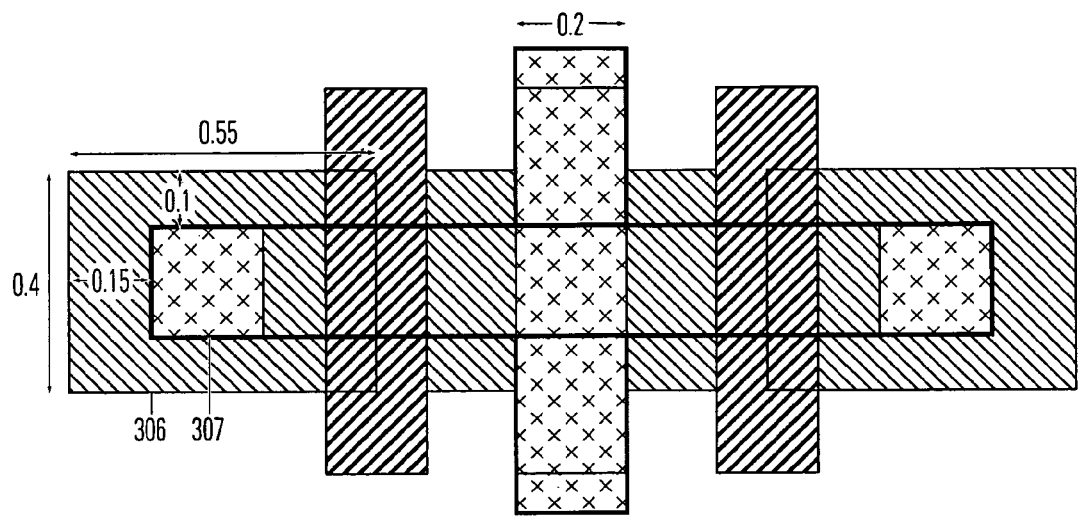
FIG. 19 is a layout view showing photoresist exposure mask shapes for defining phase change material side wall pin width.

FIG. 19 illustrates the layout of the photolithographic mask used for formation of the photoresist mask (or hard mask). The photolithographic mask 307 has a width of about 0.2 microns for a lithographic process with a 0.2 micron minimum feature, size. After development of a pattern illustrated in FIG. 19, the photographic mask 307 is trimmed as described above to define a width for the side wall active pin as described in more detail above. The mask in illustrated embodiment extends to within about 0.15 microns of the edge of the stack defined by the rectangle 306, subject to mask alignment limitations, and is placed near the center of the rectangle 306.

Figure 20:
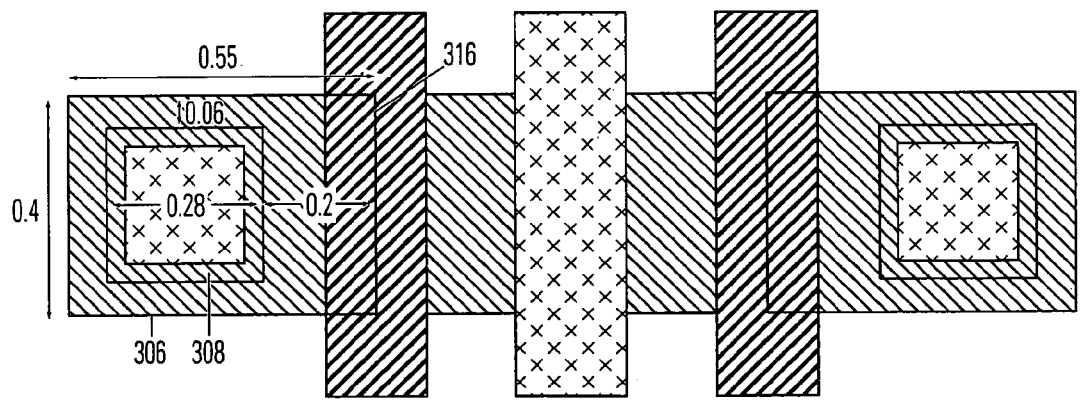
FIG. 20 is a layout view showing the via opening mask shapes.

FIG. 20 illustrates the layout of a mask used for defining the placement of vias within which to place the plugs, such as plug 126 of FIG. 4, for connection from the top electrode layer to the bit line metallization. In the illustrated embodiment, the via pattern 308 is about 0.28 microns square, placed about 0.2 microns from the edge 316 of the rectangle 306 over the polysilicon line 301, and placed about 0.06 microns from the edge defining the width of the stack.

Figure 21:
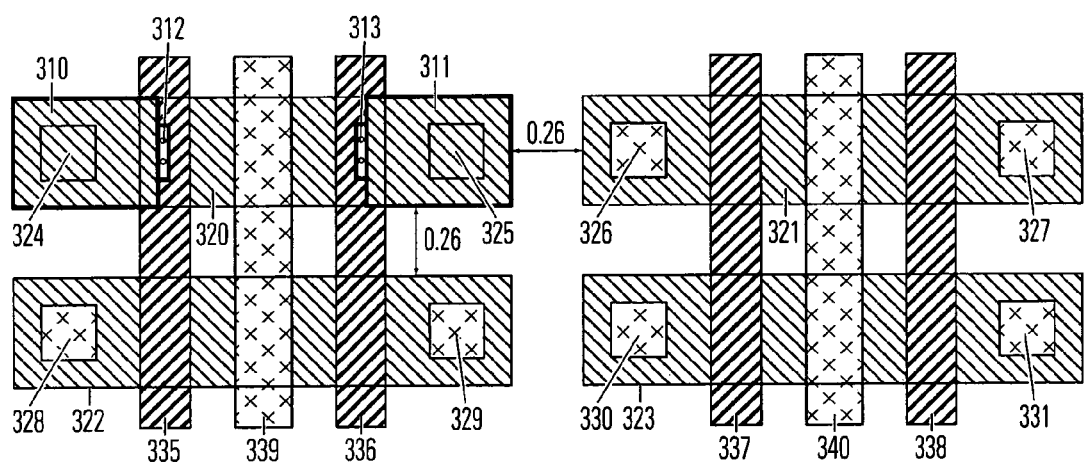
FIG. 21 shows an example of an eight cell array layout for a memory cells as described herein, without bit line metallization.

FIG. 21 shows an array structure in which eight memory cells are laid out, with the locations of two electrode stacks 310, 311 and side wall active pins 312, 313 shown for the upper left-hand pair of cells. Active regions 320, 321, 322, 323 are illustrated. Memory cell electrode stacks 310, 311 are located over the contact plugs 324, 325 in the first active region 320; memory cell stacks (not shown) are located over the plugs 326, 327 in the second active region 321; memory cell stacks (not shown) are located over the plugs 328, 329 in the third active region 322; and memory cell stacks (not shown) are located over the plugs 330, 331 in the fourth active region 323. Polysilicon word lines 335, 336 overlie the active regions 320 and 322 along respective rows of memory cells. Likewise, polysilicon word lines 337, 338 overlie the active regions 321, 323 along respective rows of memory cells. Metal line 339 extends between the polysilicon word lines 335 and 336 over the active regions 320, 322, between the two rows of memory cells coupled to the polysilicon word lines 335, 336. Likewise, metal line 340 extends between the polysilicon word lines 337 and 338 over the active regions 321, 323, between the two rows of memory cells coupled to the polysilicon word lines 337, 338. In the illustrated layout, the active regions 320, 321 are separated by about 0.26 microns. Likewise, the active regions 320 and 322 are separated by about 0.26 microns.

The dimensions described with reference to FIGS. 17-21 are representative of the lithographic process with a minimum feature size of about 0.2 microns, and will vary with manufacturing processes used to implement the cells.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of forming a memory cell, comprising:
   forming a first electrode, an insulating layer over the first electrode, a second electrode over the insulating layer, and a protective layer over the second electrode, with a side wall on the insulating layer;
   forming a side wall spacer on the side wall, the spacer comprising a layer of a programmable resistive material in electrical communication with the first and second electrodes, the side wall spacer having a length extending from the first electrode to the second electrode along the side wall, a width generally orthogonal to the length, the spacer, the first electrode and the second electrode having respective thicknesses which are less than 40 nm, and wherein forming the side wall spacer comprises
   depositing a layer of the programmable resistive material over the side wall and on the protective layer;
   anisotropically etching the layer of programmable resistive material to remove programmable resistive material in areas other than the side wall;
   forming a fill material on the protective layer and surrounding the programmable resistive material on the side wall;
   planarizing the fill material to expose tops of the programmable resistive material on the sidewall and leave a remaining portion of the protective layer over the second electrode;
   forming an etch mask having a lithographic pattern to define a lithographic width;
   trimming the etch mask to provide a trimmed mask to define a pattern; and
   selectively etching the programmable resistive material according to the pattern, to define the width of the side wall spacer, the width being less than 40 nm.

2. The method of claim 1, wherein said trimming includes anisotropically etching the etch mask to provide said trimmed mask.

3. The method of claim 1, wherein the anisotropically etching comprises using a plasma etching process.

4. The method of claim 1, wherein the anisotropically etching comprises using a reactive ion etching process.

5. The method of claim 1, wherein the programmable resistive material comprises a chalcogenide.

6. The method of claim 1, wherein the programmable resistive material has at least two solid phases which are reversibly inducible by a current.

7. The method of claim 1, wherein the programmable resistive material has at least two solid phases which include a generally amorphous phase and a generally crystalline phase.

8. The method of claim 1, wherein the programmable resistive material comprises $Ge_2Sb_2Te_5$.

9. The method of claim 1, wherein the programmable resistive material comprises a combination of two or more materials from the group of Ge, Sb, Te, Se, In, Ti, Ga, Bi, Sn, Cu, Pd, Pb, Ag, S, or Au.

10. The method of claim 1, wherein the selectively etching comprises partially etching the programmable resistive material to leave a residual layer of programmable resistive material along a bottom portion of the sidewall and surrounding the first electrode.

11. A method of forming a spacer memory cell, comprising:
forming a first electrode, an insulating layer over the first electrode, a second electrode over the insulating layer, and a protective layer over the second electrode, with a side wall on the insulating layer using a lithographic process;
forming a side wall spacer on the side wall, the spacer comprising a layer of a programmable resistive material in electrical communication with the first and second electrodes, the side wall spacer having a length extending from the first electrode to the second electrode along the side wall, a width generally orthogonal to the length, the spacer, the first electrode and the second electrode having respective thicknesses which are less than 40 nm, and wherein forming the side wall spacer comprises:
depositing a layer of the programmable resistive material over the side wall and on the protective layer;
anisotropically etching the layer of programmable resistive material to remove programmable resistive material in areas away other than the side wall;
forming a fill material on the protective layer and surrounding the programmable resistive material on the side wall;
planarizing the fill material to expose tops of the programmable resistive material on the sidewall and leave a remaining portion of the protective layer over the second electrode;
forming an etch mask having a lithographic pattern to define a lithographic width;
trimming the etch mask to provide a trimmed mask to define a pattern having a dimension less than a minimum feature size specified for the lithographic process; and
selectively etching the programmable resistive material according to the pattern, to define the width of the side wall spacer, the width being less than the minimum feature size.

12. The method of claim 11, wherein the programmable resistive material comprises a chalcogenide.

13. The method of claim 11, wherein the programmable resistive material has at least two solid phases which are reversibly inducible by a current.

14. The method of claim 11, wherein the programmable resistive material has at least two solid phases which include a generally amorphous phase and a generally crystalline phase.

15. The method of claim 11, wherein the programmable resistive material comprises $Ge_2Sb_2Te_5$.

16. The method of claim 11, wherein the programmable resistive material comprises a combination of two or more materials from the group of Ge, Sb, Te, Se, In, Ti, Ga, Bi, Sn, Cu, Pd, Pb, Ag, S, or Au.

17. The method of claim 11, wherein the selectively etching comprises partially etching the programmable resistive material to leave a residual layer of programmable resistive material along a bottom portion of the sidewall and surrounding the first electrode.

18. A memory device, including:
a first electrode,
an insulating member over the first electrode, the insulating member having a side wall;
a second electrode over the insulating member;
a programmable resistive material spacer along the side wall of the insulating member and in electrical communication with the first and second electrodes, the spacer comprising a lower portion surrounding the first electrode and an upper portion having a length extending from the lower portion to the second electrode along the side wall on the insulating layer, a width generally orthogonal to the length, and a thickness, and wherein the width and the thickness are less than 40 nm; and
the spacer, the first electrode and the second electrode having respective thicknesses which are less than 40 nm, wherein the spacer, the first electrode and the second electrode have respective thicknesses which are less than a minimum lithographic feature size of a lithographic process used to form the device.

19. The device of claim 18, wherein the programmable resistive material has at least two solid phases which are reversibly inducible by a current.

20. The device of claim 19, wherein the at least two solid phases include a generally amorphous phase and a generally crystalline phase.

21. The device of claim 18, wherein the insulating member has a thickness between the first and second electrodes, and the length of the upper portion of the spacer extending from the lower portion to the second electrode is substantially equal to the thickness of the insulating member.

22. The device of claim 18, wherein the programmable resistive material spacer comprises $Ge_2Sb_2Te_5$.

23. The device of claim 18, wherein the programmable resistive material spacer comprises a combination of two or more materials from the group of Ge, Sb, Te, Se, In, Ti, Ga, Bi, Sn, Cu, Pd, Pb, Ag, S, or Au.

24. The device of claim 18, wherein the spacer has a thickness of 10 to 20 nm.

25. The device of claim 18, wherein the first electrode comprises Ti and N.

26. The device of claim 18, wherein the first electrode comprises Ta and N.

27. The device of claim 18, wherein the first electrode has a thickness of 10 to 30 nm.

28. A memory device, including:
a first electrode,
an insulating member over the first electrode, the insulating member having a side wall;
a second electrode over the insulating member;
a programmable resistive material spacer along the side wall of the insulating member and in electrical communication with the first and second electrodes, the spacer comprising a lower portion surrounding the first electrode and an upper portion having a length extending from the lower portion to the second electrode along the side wall on the insulating layer, a width generally orthogonal to the length, and a thickness, and wherein the width and the thickness of the spacer are less than 40 nm, the first electrode has a thickness less than 40 nm, and the second electrode has a thickness of 10 to 30 nm.

29. An integrated circuit comprising:

a semiconductor substrate;

an array of access transistors having terminals including doped regions in the semiconductor substrate adapted to connect respective drain terminals to a reference potential;

a plurality of word lines coupled to gate terminals of access transistors along respective rows in the array of access transistors;

an array of programmable memory cells, the programmable memory cells in the array respectively comprising a bottom electrode, an insulating member over the bottom electrode, the insulating member having a side wall, a top electrode over the insulating member, and a programmable resistive material spacer along the side wall of the insulating member and in electrical communication with the top and bottom electrodes, the spacer having a length extending from the bottom electrode to the top electrode along the side wall on the insulating layer, a width generally orthogonal to the length, and a thickness, and wherein the width and the thickness are less than 40 nm;

a plurality of bit lines over the array of memory cells, arranged along respective columns of memory cells in the array of programmable memory cells;

a first plurality of contacts connecting bottom electrodes of respective memory cells with corresponding drain terminals of access transistors in the array of access transistors; and a second plurality of contacts connecting top electrodes of respective memory cells with corresponding bit lines in the plurality of bit lines.

30. The integrated circuit of claim 29, wherein the programmable resistive material has at least two solid phases which are reversibly inducible by a current.

31. The integrated circuit of claim 30, wherein the at least two solid phases include a generally amorphous phase and a generally crystalline phase.

32. The integrated circuit of claim 29, wherein the spacer, the first electrode and the second electrode have respective thicknesses which are less than a minimum lithographic feature size of a lithographic process used to form the device.

33. The integrated circuit of claim 29, wherein the programmable resistive material spacer comprises $Ge_2Sb_2Te_5$.

34. The integrated circuit of claim 29, wherein the programmable resistive material spacer comprises a combination of two or more materials from the group of Ge, Sb, Te, Se, In, Ti, Ga, Bi, Sn, Cu, Pd, Pb, Ag, S, or Au.

* * * * *

UNITED STATES PATENT AND TRADEMARK OFFICE
CERTIFICATE OF CORRECTION

PATENT NO. : 7,608,503 B2  Page 1 of 1
APPLICATION NO. : 11/285473
DATED : October 27, 2009
INVENTOR(S) : Lung et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 665 days.

Signed and Sealed this

Fourteenth Day of December, 2010

David J. Kappos
*Director of the United States Patent and Trademark Office*